United States Patent [19]

Tanaka et al.

[11] Patent Number: 5,672,987
[45] Date of Patent: Sep. 30, 1997

[54] POTENTIAL DIFFERENCE TRANSMISSION DEVICE AND SEMICONDUCTOR MEMORY DEVICE USING THE SAME

[75] Inventors: Isao Tanaka, Katano; Tsuguyasu Hatsuda, Neyagawa, both of Japan

[73] Assignee: Matsushita Electric Industrial Co., Ltd., Kadoma, Japan

[21] Appl. No.: 656,721

[22] Filed: Jun. 3, 1996

[30] Foreign Application Priority Data

Jun. 8, 1995 [JP] Japan ................................. 7-141535

[51] Int. Cl.$^6$ ................................................. G11C 27/02
[52] U.S. Cl. ........................... 327/91; 327/94; 327/96; 327/379
[58] Field of Search ........................... 327/91, 33, 94, 327/96, 337, 379

[56] References Cited

U.S. PATENT DOCUMENTS

| | | | |
|---|---|---|---|
| 5,365,129 | 11/1994 | Slemmer et al. | 327/91 |
| 5,510,737 | 4/1996 | Arvidsson | 327/91 |
| 5,546,028 | 8/1996 | Yamaguchi | 327/91 |

FOREIGN PATENT DOCUMENTS 64-35794  2/1989  Japan.
2-308489  12/1990  Japan.

*Primary Examiner*—Tan T. Nguyen
*Attorney, Agent, or Firm*—Renner, Otto, Boisselle, Sklar

[57] ABSTRACT

A semiconductor memory device 200 includes: a memory cell array 101 including a plurality of pairs of bit lines (BL, XBL), a plurality of word lines WL and a plurality of memory cells 100; a decoder 104 for decoding address information to activate one of the plurality of word lines WL in accordance with the address information; precharge circuits 105 for setting each of the plurality of pair of bit lines (BL, XBL) to a predetermined precharge potential; sense amplifiers 110; and potential difference transmission circuits 109 provided between the memory cell array 101 and the sense amplifiers 110. The potential difference transmission circuits 109 hold a potential difference $V_{do}$ between respective pair of bit lines among the plurality of pairs of bit lines (BL, XBL) and transmit the held potential difference $V_{do}$ between the pair of bit lines to a respective sense amplifier 110. The sense amplifier 110 amplifies the potential difference $V_{do}$ between the pair of bit lines transmitted by the potential difference transmission circuit 109 so as to output the data stored in a corresponding memory cell.

1 Claim, 6 Drawing Sheets

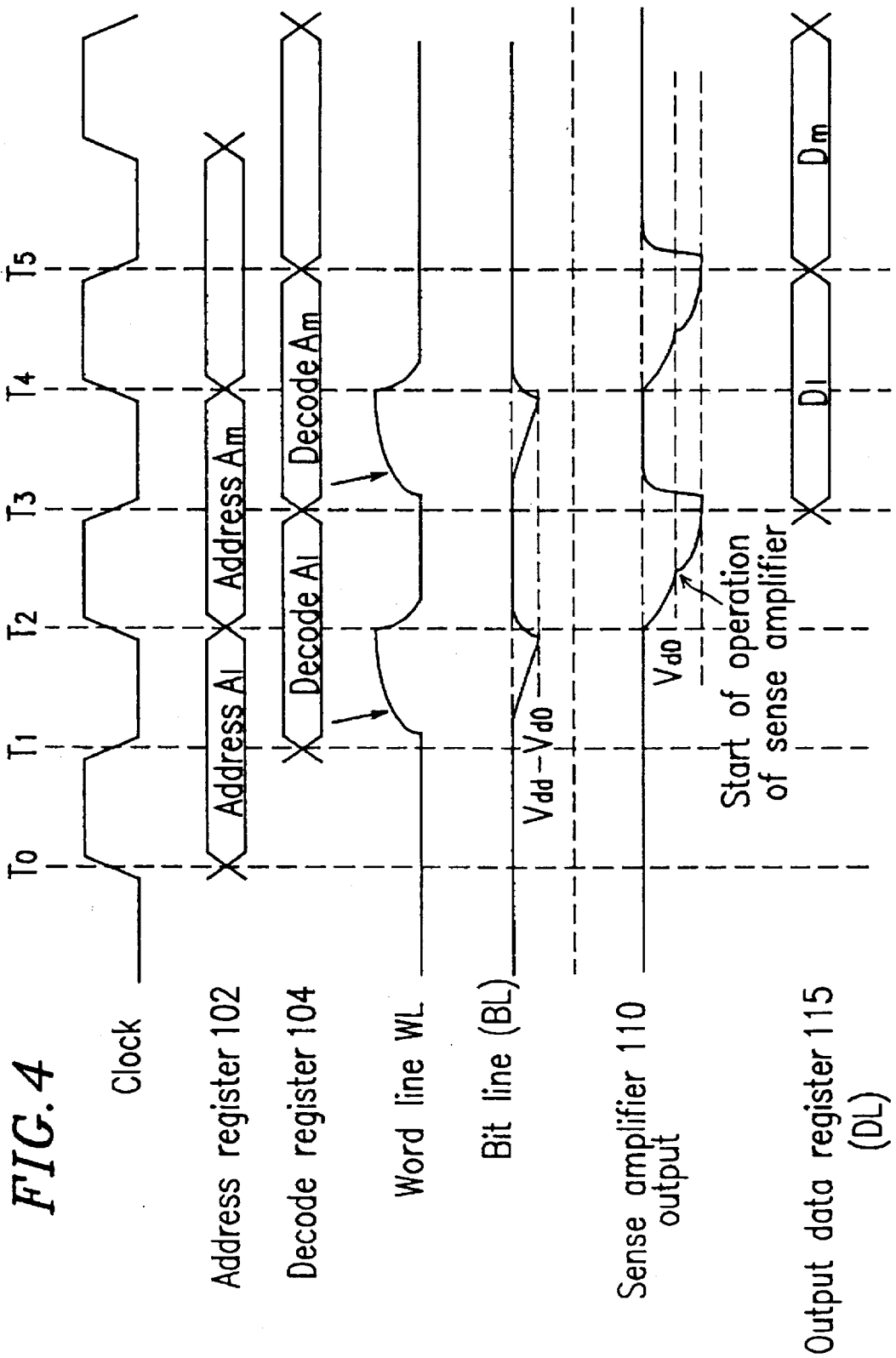

POTENTIAL DIFFERENCE TRANSMISSION DEVICE AND SEMICONDUCTOR MEMORY DEVICE USING THE SAME

BACKGROUND OF THE INVENTION

1. Field of the Invention

The present invention relates to a potential difference transmission device and a semiconductor memory device such as a static random access memory (SRAM) using such a potential difference transmission device. In particular, the present invention relates to a semiconductor memory device to which a pipeline technique is applied.

2. Description of the Related Art

A pipeline technique is widely employed in the logic LSI of microprocessors and the like so as to increase the operation speed. For example, Japanese Patent Publication No. 64-35794 describes that the pipeline technique is applied to a memory so as to realize memory capable of operating at high speeds. This patent publication describes a random access memory which employs pipelining, in which a latch circuit temporarily storing 1 bit of information is provided between an address decoder and a memory cell array.

In the configuration as described above, all signal amplitudes in the memory are set to be equal to a full amplitude of the CMOS. As a result, the operation time of the latch circuit is prolonged. Consequently, the latch circuit Significantly obstructs reduction of the cycle time. Moreover, in the case where the pipeline operation is realized by using a latch or a register during a time period from the input of an address decoder to the output of a sense amplifier, the processing performed in a memory cell array, that is, the processing from activation of a word line to validation of an output of the sense amplifier cannot be divided into a plurality of steps. The memory cycle time in the memory system employing the pipelining is dependent on the processing time of the stage requiring the longest processing time. The necessary time periods of the respective pipelined stages are compared with each other. As a result, it is found that the aforementioned undividable processing stage in the memory cell array requires the longest time period among all stages and thus determines the total cycle time. Therefore, if the stage in the memory cell array cannot be carried out at increased speed, a pipeline RAM having reduced cycle time cannot be realized by pipelining the processing.

An ideal pipelined processor decodes one instruction during each machine cycle. In order to maintain this speed, it is necessary to supply instructions and data via the pipeline at least at the rate of decoding by the processor. The stages of the pipeline are synchronized normally by using a clock. In order to assure data transmission throughout the pipeline processing, the clock is required to have a speed suitable for the latest transmission path. In the system including the pipeline memory, the access stage of the memory is one of the longest delay paths. Therefore, the speed at which the data is supplied from the pipeline memory determines the total speed of the pipeline processor system. Accordingly, in order to improve the system performance, it is essential to improve the speed of the pipeline memory.

SUMMARY OF THE INVENTION

The potential difference transmission device of this invention includes: a capacitor element for storing a charge; a switching element connected to one end of the capacitor element, which is turned so as to electrically connect one of a data input terminal and a ground line to the end of the capacitor element; and a potential determination circuit for determining a potential of the other end of the capacitor element.

According to another aspect of the invention, a semiconductor memory device of this invention includes: a memory cell array including a plurality of pairs of bit lines, a plurality of word lines and a plurality of memory cells; a decoder for decoding address information to activate one of the plurality of word lines in accordance with the address information; a precharge circuit for setting each of the plurality of pair of bit lines to a predetermined precharge potential; a sense amplifier; and a potential difference transmission circuit provided between the memory cell array and the sense amplifier, which holds a potential difference between one pair of bit lines among the plurality of pairs of bit lines and transmits the held potential difference between the pair of bit lines to the sense amplifier, wherein the sense amplifier amplifies the potential difference between the pair of bit lines transmitted by the potential difference transmission circuit so as to output the data stored in a corresponding memory cell.

In one embodiment of the invention, the potential difference of a pair of the plurality of bit lines held and transmitted by the potential difference transmission circuit has a value equal to or larger than a smallest operation guarantee value $V_{th}$ of the sense amplifier and smaller than the potential difference in the memory cell.

In another embodiment of the invention, the potential difference of a pair of the plurality of bit lines held and transmitted by the potential difference transmission circuit is substantially equal to the smallest operation guarantee value $V_{th}$.

In still another embodiment of the invention, the potential difference transmission circuit includes: a capacitor element for storing a charge; a switching element connected to one end of the capacitor element, which is turned so as to electrically connect one of the bit line and a ground line to the one end of the capacitor element; and a potential determination circuit for determining a potential of the other end of the capacitor element.

In still another embodiment of the invention, the semiconductor memory device further includes a timing control circuit for generating a first control signal defining the time at which the switching element is turned and a second control signal defining the time at which the potential determination circuit determines the potential of the other end of the capacitor element, wherein the first control signal is supplied to the switching element, while the second control signal is supplied to the potential determination circuit.

In still another embodiment of the invention, the potential of the other end of the capacitor element determined by the potential determination circuit is substantially equal to the precharge potential determined by the precharge circuit.

In still another embodiment of the invention, the semiconductor memory device executes pipeline processing including a plurality of stages, and the potential difference transmission circuit functions as a pipeline register for storing an output of one of the plurality of stages.

In still another embodiment of the invention, a potential difference between a pair of the plurality of bit lines held and transmitted by the potential difference transmission circuit is equal to or larger than a smallest operation guarantee value $V_{th}$ of the sense amplifier and smaller than the potential difference in the memory cell.

In still another embodiment of the invention, the potential difference of a pair of the plurality of bit lines held and transmitted by the potential difference transmission circuit is substantially equal to a smallest operation guarantee value $V_{th}$ of the sense amplifier.

In still another embodiment of the invention, the plurality of stages include: a first stage, the first stage including from the input of the address information to the decoding of the address information; a second stage, the second stage including from the activation of the word line to the occurrence of the potential difference between the pair of bit lines; a third stage, the third stage including from transmission of the potential difference of the pair of bit lines to the amplification of data by means of the sense amplifier; and a fourth stage for externally outputting the data.

The semiconductor memory device of the present invention includes a potential difference transmission circuit inserted between the memory cell array and the sense amplifier. The potential difference transmission circuit includes a capacitor element and a switching element. The potential difference transmission circuit holds the potential difference between a pair of bit lines, and transmits the held potential difference to the next stage of the pipeline processing. The potential amplitude of the pair of bit lines can be restrained to be small by the potential difference transmission circuit. As a result, the delay time required for this period is reduced. This can reduce the processing time period in the memory cell array which requires the longest processing time, thereby equalizing the time periods of the stages included in the pipeline processing. As a result, the total cycle time of the memory employing the pipelining is shortened.

The effect of the present invention will be described.

According to the present invention, owing to the aforementioned configuration, it is possible to transmit the potential difference between small amplitudes of the pair of bit lines to the next stage of pipeline processing while maintaining the small amplitudes. Thus, it is possible to reduce the processing time in the memory cell array which generally takes a considerable time period for memory access time. As a result, the memory cycle time can be remarkably reduced.

Thus, the invention described herein makes possible the advantages of: (1) providing a potential difference transmission device for realizing a pipeline memory system capable of operating at a high speed with low power consumption; and (2) providing a semiconductor memory device employing such a potential difference transmission device.

These and other advantages of the present invention will become apparent to those skilled in the art upon reading and understanding the following detailed description with reference to the accompanying figures.

BRIEF DESCRIPTION OF THE DRAWINGS

FIG. 4 is a timing chart for illustrating the read operation of the semiconductor memory device 200 in detail.

DESCRIPTION OF THE PREFERRED EMBODIMENTS

Hereinafter, the present invention will be described with reference to the drawings by way of illustrative examples.

Figure 1:
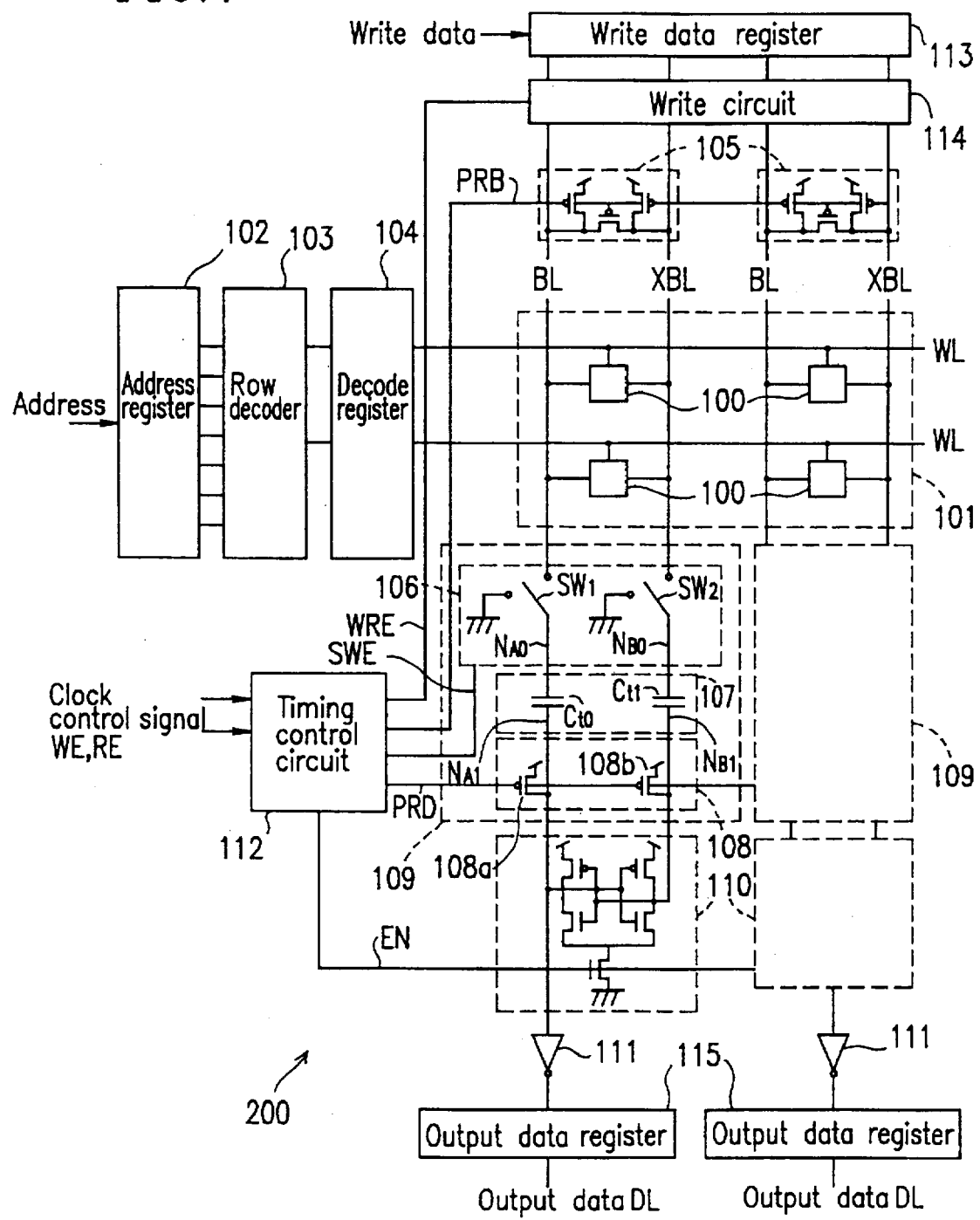
FIG. 1 is a diagram showing the configuration of a semiconductor memory device 200 according to the present invention.

FIG. 1 shows the configuration of a semiconductor memory device 200 according to the present invention. The semiconductor memory device 200 includes a memory cell array 101. The memory cell array 101 includes a plurality of memory cells 100 for storing data. The memory cells 100 are connected to pairs of bit lines BL and XBL for outputting the data stored in the memory cells 100, respectively. The memory cells 100 are connected to word lines WL controlling the input/output of data to the memory cells 100.

The semiconductor memory device 200 further includes an address register 102 for storing an address, a row decoder 103 for decoding row address information and a decode register 104 for storing the decode information. The decode register 104 is connected to an output terminal of the row decoder 103.

The semiconductor memory device 200 further includes potential difference transmission circuits 109, sense amplifiers 110, inverters 111 and output data registers 115. The pair of bit lines BL and XBL are input to the respective potential difference transmission circuit 109. An output of the potential difference transmission circuit 109 is connected to the sense amplifier 110 for amplifying the data which is read on the pair of bit lines BL and XBL. The outputs of the sense amplifiers 110 are connected to the inverters 111 functioning as output circuits. The outputs of the inverters 111 are connected to the output data registers 115 for storing the data read from the memory cells 100.

The semiconductor memory device 200 further includes a write data register 113 for storing write data, a write circuit 114 for writing the write data to the memory cells 100, precharge circuits 105 for charging the pairs of bit lines BL and XBL to a predetermined precharge level (in this example, a power source potential $V_{dd}$) and a timing control circuit 112 for controlling the write circuit 114, the potential difference transmission circuits 109, the precharge circuits 105 and the sense amplifiers 110.

The potential difference transmission circuits 109 hold a potential difference between a pair of bit lines BL and XBL, and then transmit the held potential difference to the sense amplifiers 110. The potential difference transmission circuits 109 include a capacitor section 107, a potential determination section 108 and a switch section 106.

The capacitor section 107 includes a capacitor element $C_{t0}$ and $C_{t1}$ (each having a capacity of $C_0$) for accumulating electric charges.

The potential determination section 108 sets the potential of a node connecting the capacitor section 107 to the sense amplifier 110. The potential determination section 108 includes P-channel MOS transistors (hereinafter, referred to as PMOSTr) 108a and 108b.

The switch section 106 is inserted between the memory cell array 101 and the capacitor section 107. The switch section 106 includes a switch $SW_1$ and a switch $SW_2$. The switch $SW_1$ is turned so as to electrically connect either the bit line BL or a ground line to one end of the capacitor element $C_{r0}$. The switch $SW_2$ is turned so as to electrically connect either the bit line XBL or a ground line to one end of the capacitor element $C_{r1}$.

The timing control circuit 112 receives a clock signal, an external control signal WE and an external control signal RE to Generate various internal timing control signals that are synchronous with the clock signal in accordance with the external control signals WE and RE.

Figure 2:
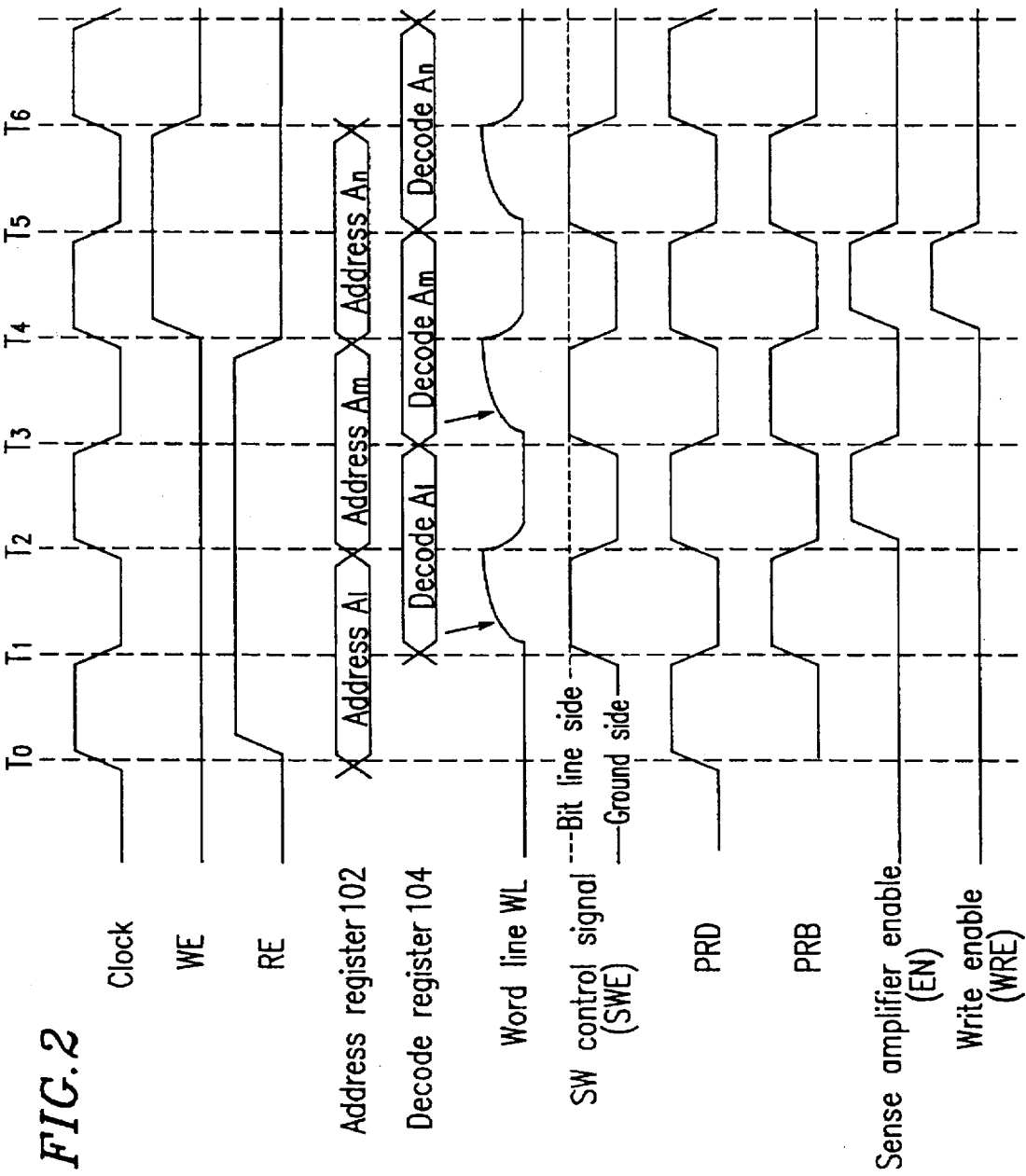
FIG. 2 is a timing chart for illustrating the relationship between a signal input to a timing control circuit 112 and a signal output from the timing control circuit 112.

FIG. 2 illustrates the timing of a signal input to the timing control circuit 112 and a signal output therefrom.

The timing control circuit 112 supplies a write enable signal WRE to the write circuit 114. The write enable signal WRE is used to define the time at which the write circuit 114 writes data.

The timing control circuit 112 supplies a precharge enable signal PRB to the precharge circuits 105. The precharge enable signal PRB is used to define the time at which the precharge circuits 105 precharges the pair of bit lines BL and XBL.

The timing control circuit 112 supplies a SW control signal (SWE) to the switch section 106. The SW control signal (SWE) is used to define the time at which the switches $SW_1$ and $SW_2$ of the switch section 106 are turned. In the case where the SW control signal (SWE) is at a High level, the switch $SW_1$ is turned to connect the bit line BL to one end of the capacitor element $C_{r0}$ while the switch $SW_2$ is turned to connect the bit line XBL to one end of the capacitor element $C_{r1}$. In the case where the SW control signal (SWE) is at a Low level, the switch $SW_1$ is turned to connect the ground line to one end of the capacitor element $C_{r0}$ while the switch $SW_2$ is turned to connect the ground line to one end of the capacitor element $C_{r1}$.

The timing control circuit 112 supplies an enable signal PRD to the potential determination circuits 108. The enable signal PRD is used to define the time at which the potential determination circuits 108 determine the potential of the node between the capacitor section 107 and the sense amplifier 110.

The timing control circuit 112 supplies a sense amplifier enable signal EN to the sense amplifiers 110. The sense amplifier enable signal EN is used to define the time at which the sense amplifiers 110 are activated.

Figure 3:
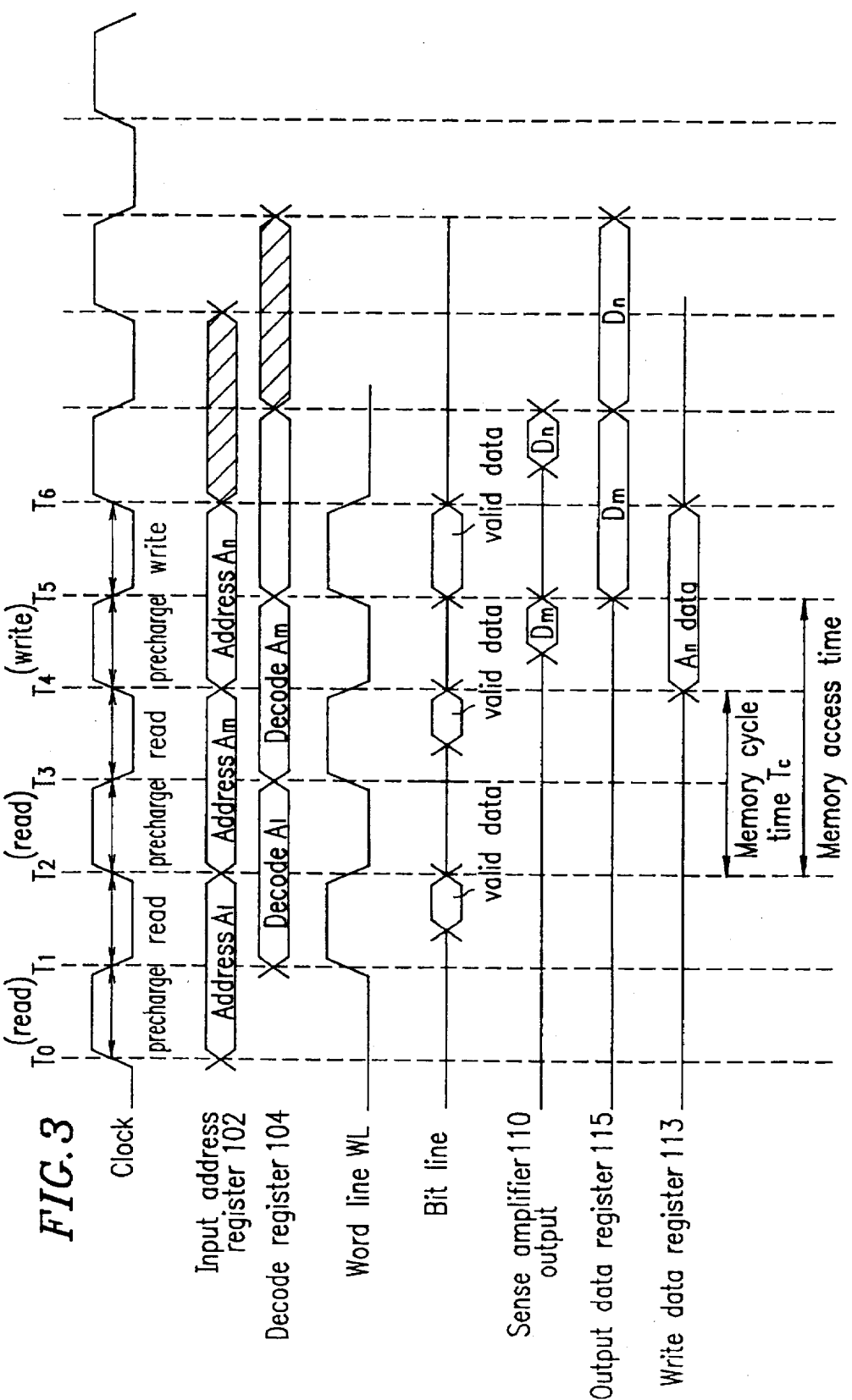
FIG. 3 is a timing chart for illustrating the operation of the semiconductor memory device 200.

Hereinafter, the operation of the semiconductor memory device 200 having the aforementioned configuration will be described with reference to FIGS. 3 and 4. FIGS. 3 and 4 are timing charts of the semiconductor memory device 200. FIG. 3 schematically shows the operational timing, and FIG. 4 shows the operational timing during read operation in more detail. In FIGS. 3 and 4, the same time represents the same time axis. In this embodiment of the present invention, the case where the data is successively read for two cycle periods will be described.

In the semiconductor memory device 200 according to the present invention, all the pairs of bit lines BL and XBL are precharged to a precharge level ($V_{dd}$) during an initial state at time $T_0$. The switches $SW_1$ and $SW_2$ included in the switch section 106 are connected to the side of the memory cell array 101. There occurs no difference in potential between both ends of each of the capacitor elements $C_{r0}$ and $C_{r1}$.

First, the case where a start address of access indicates an address $A_1$ will be described. At time $T_0$, an access instruction for a memory region is issued. At time $T_1$, the corresponding decode information is stored in the decode register 104 in accordance with the address information $A_1$ stored in the address register 102. Then, at time $T_1$, a corresponding word line WL is activated in accordance with the output of the decode register 104, thereby reading the data stored in the memory cell 100 on the pair of bit lines BL and XBL. In this embodiment of the present invention, the case where the data at a "Low" level is stored in the memory cell 100 is described as an example. When the data is started to be read, the bit line BL is in a precharge state. By reading the data from the memory cell 100, the potential of the bit line BL is gradually lowered to a "Low" level.

At time $T_2$, the memory system moves to a next pipeline stage. At this point, the potential of the bit line BL is discharged to the level ($V_{dd}-V_{d0}$) to set the potentials of both ends of the capacitor element $C_{r0}$ at $V_{dd}$ and ($V_{dd}-V_{d0}$), respectively. Therefore, charges $Q=C_0*V_{d0}$ are generated at both ends of the capacitor element $C_{r0}$. At this point, since the potential level of the bit line XBL remains at the power source potential $V_{dd}$ level, no charge occurs at both ends of the capacitor element $C_{r1}$. The PMOSTrs 108a and 108b of the potential determination section 108 are turned OFF, so that the switches $SW_1$ and $SW_2$ of the switch section 106 are connected to the ground line side. As a result, the potentials of a node $N_{A0}$ of the bit line BL and a node $N_{B0}$ of the bit line XBL are set at ground level. Since the charges Q at both ends of the capacitor element $C_{r0}$ are held, the potential $V_x$ at a node $N_{A1}$ becomes $V_{d0}$, as is calculated by the following Equation 1.

$$V_x=Q/C=(C_{r0}*V_{d0})/C_{r0}=V_{d0} \qquad [\text{Equation 1}]$$

On the other hand, a node $N_{B1}$ becomes 0 V due to retention of the charges in the undischarged bit line XBL in the similar manner.

For convenience, the above description assumes the ideal state where only the capacitor elements $C_{r0}$ and $C_{r1}$ are present for the pair of bit lines BL and XBL as capacitors. In the case where other parasitic capacitances are present, the parasitic capacitors should be taken into consideration. However, such a case only differs from the aforementioned case in that charges are also retained in the parasitic capacitors. As in the above description, the potential differences between the pair of bit lines BL and XBL are transmitted to the respective sense amplifiers 110 by the respective potential difference transmission circuit 109 in the case where parasitic capacitors are present.

When the sense amplifiers 110 are activated, the potential differences between the pair of bit lines BL and XBL, which are transmitted by the potential difference transmission circuits 109, are amplified by the sense amplifiers 110 so as to output the data. In this embodiment of the present invention, the relative potential level of the bit lines between one end and the other end of the capacitor element (a potential difference between the node $N_{A0}$ and the node $N_{B0}$ and a potential difference between the node $N_{A1}$ and the node $N_{B1}$) appears in an inverted manner. Therefore, by using the inverters 111 to invert the polarity of the output of the sense amplifiers 110, the polarity of the data to be stored in the output data register 115 is made identical with that of the data to be stored in the memory cells 100. At this point in time, the pair of bit lines BL and XBL on the side of the memory cell array 101 are separated from the potential difference transmission circuits 109 by the respective switch sections 106, and are allowed to prepare for a next memory access request by the precharge circuits 105.

When the potential difference $V_{do}$ occurring on the pair of bit lines exceeds or is equal to a smallest operation guarantee value $V_{th}$ of the sense amplifier 110 at this stage, the data output is performed in a normal manner. More specifically, the normal data output is performed as long as the drop of potential of the bit lines at this stage exceeds or is equal to $V_{th}$. Thus, it is not necessary to operate the bit lines at a full amplitude of CMOS at this stage.

Figure 5A:
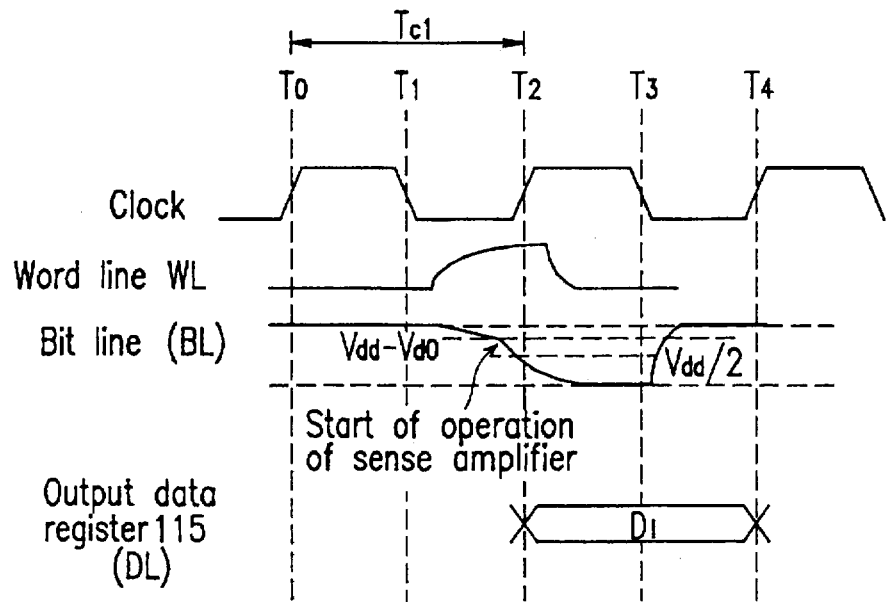
FIG. 5A is a timing chart for illustrating the change in potential of a bit line BL in a semiconductor memory device employing conventional pipelining.

FIG. 5A shows the change in potential of the bit line BL in a semiconductor memory device employing conventional pipelining. In FIG. 5A, a time period between time $T_1$ to time $T_2$ corresponds to the stage from activation of the word line to amplification of the data by means of the sense amplifier. When the potential of the bit line BL reaches a predetermined potential ($V_{dd}$-$V_{do}$), the sense amplifier is controlled so as to start the amplification operation. Thereafter, this stage is continued until the potential of the bit line BL is sufficiently discharged (for example, until the potential of the bit line BL becomes lower than $\frac{1}{2}V_{dd}$) because the output of the sense amplifier is required to be made valid at the end of this stage.

Figure 5B:
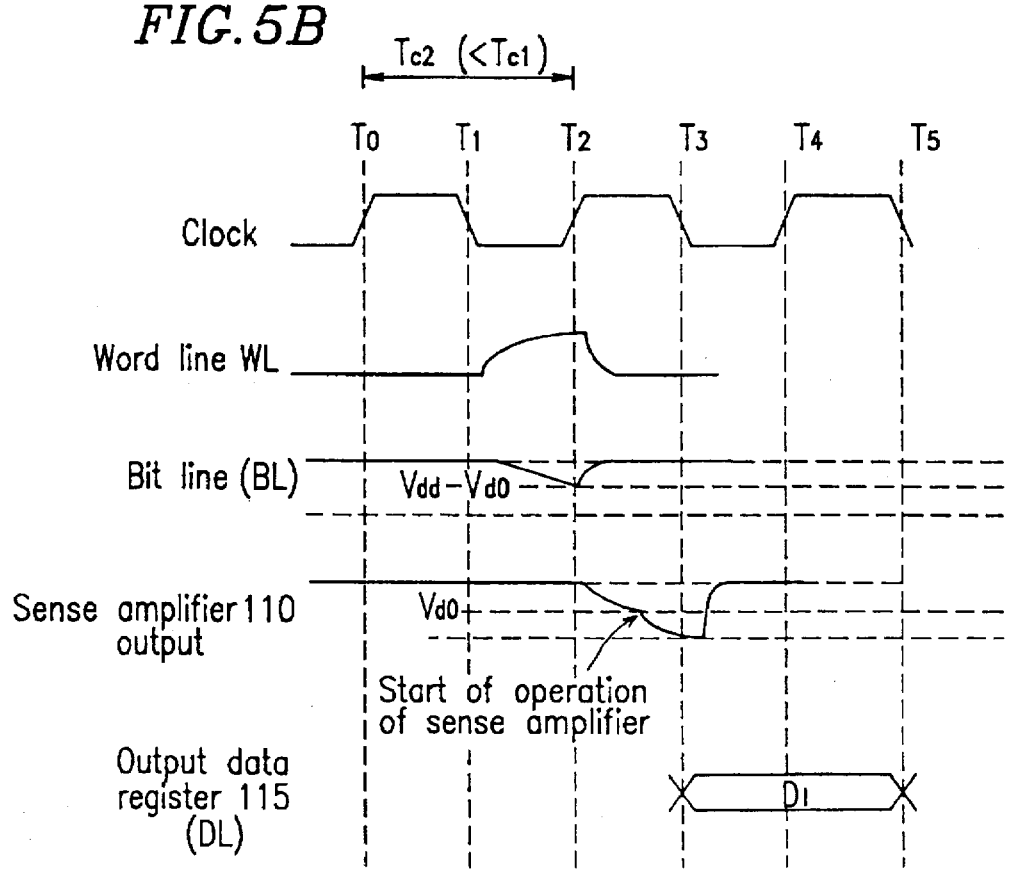
FIG. 5B is a timing chart for illustrating the change in potential of the bit line BL in the semiconductor memory device 200 according to the present invention.

FIG. 5B shows the change in potential of the bit line BL in the semiconductor memory device 200 employing the pipelining according to the present invention. In FIG. 5B, a time period from time $T_1$ to $T_3$ corresponds to the stage from activation of the word line to amplification of the data by means of the sense amplifier. It is noteworthy that, according to the present invention, the stage from activation of the word line to amplification of the data is divided into two stages: the stage from activation of the word line to occurrence of a potential difference between the pair of bit lines; and the stage from transmission of the potential difference between the pair of bit lines to amplification of the data by means of the sense amplifier. These two stages correspond to a second stage and a third stage described below, respectively.

In FIG. 5B, a time period from time $T_1$ to $T_2$ corresponds to the stage from activation of the word line to occurrence of the potential difference between the pair of bit lines. At this stage, when the potential of the bit line BL reaches a predetermined potential ($V_{dd}$-$V_{do}$), the potential difference $V_{do}$ is held by the potential difference transmission circuits 109. The potential difference $V_{do}$ held in the potential difference transmission circuits 109 is transmitted to the sense amplifiers 110 for processing at a next stage of the pipeline. In this sense, the potential difference transmission circuits 109 function as pipeline registers for storing an output of one stage among a plurality of stages.

The potential difference $V_{do}$ is set so as to be equal to or larger than the smallest operation guarantee value $V_{th}$ and to be smaller than a potential difference (in this example, $V_{dd}$) in the memory cells 100. Alternatively, the potential difference $V_{do}$ may be substantially equal to the smallest operation guarantee value $V_{th}$ of the sense amplifiers 110.

In FIG. 5B, a time period from time $T_2$ to time $T_3$ corresponds to the stage from transmission of the potential difference of the pair of bit lines to amplification of the data. The sense amplifiers 110 are controlled to start the amplification operation when the potential difference between the pair of bit lines BL and XBL reaches the predetermined potential difference $V_{do}$.

As is understood from the comparison between FIGS. 5A and 5B, $T_{c2}$ is smaller than $T_{c1}$ ($T_{c2}$<$T_{c1}$). Herein, $T_{c2}$ represents memory cycle time in the semiconductor memory device 200 according to the present invention, while $T_{c1}$ represents memory cycle time in the semiconductor memory device employing the conventional pipelining.

Figure 6A:
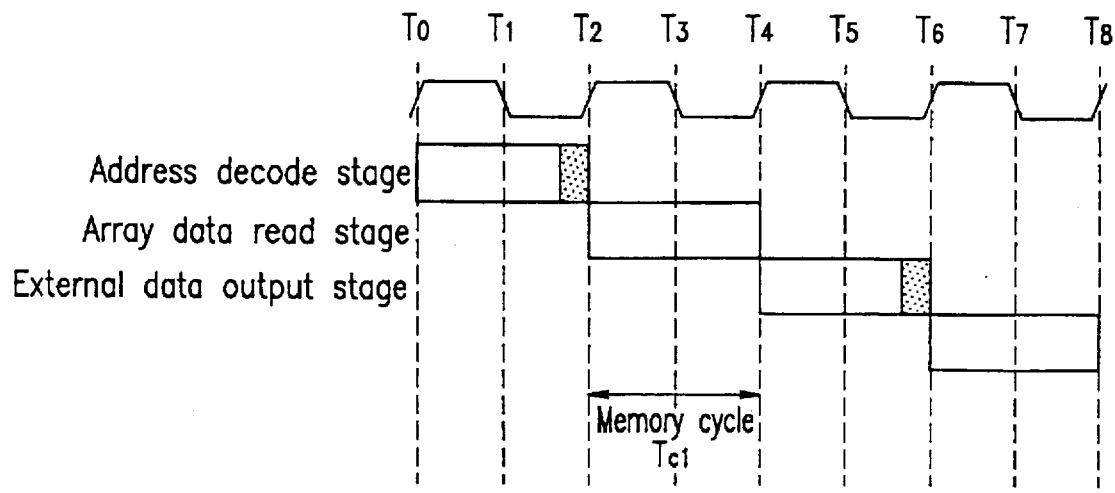
FIG. 6A is a timing chart for illustrating the flow of pipeline processing in the semiconductor memory device employing conventional pipelining.
Figure 6B:
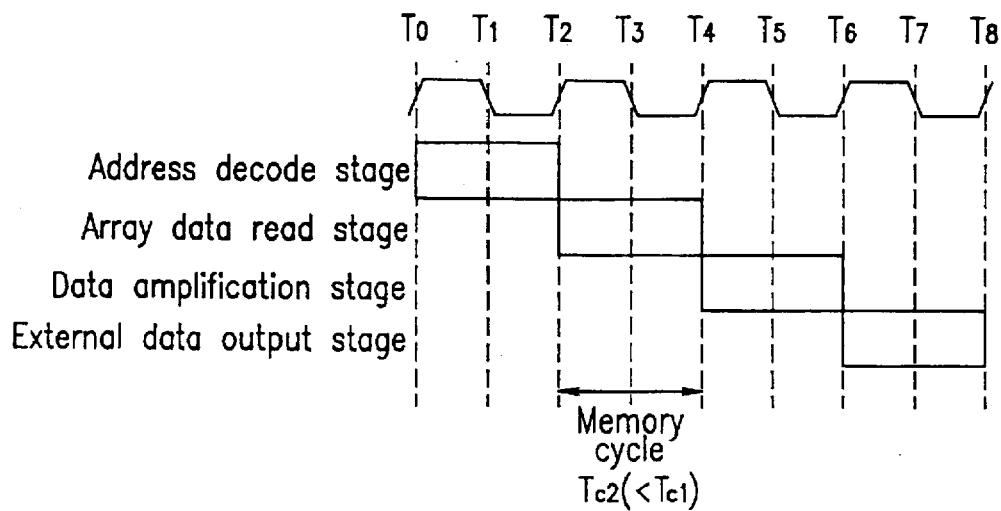
FIG. 6B is a timing chart for illustrating the flow of pipeline processing in the semiconductor memory device 200 according to the present invention.

FIG. 6A shows the flow of pipeline processing performed by using a semiconductor memory device employing conventional pipelining. FIG. 6B shows the flow of pipeline processing performed by using the semiconductor memory device 200 according to the present invention.

In this manner, according to the semiconductor memory device 200, the processing in the memory cell array 101 is divided into two stages and thus is pipelined. As a result, the processing time required in the memory cell array 101 can be remarkably reduced. In comparison of the processing time periods at the respective stages of the memory system employing the pipelining, the processing performed in the memory cell array 101 takes a considerably long time, and requires the longest processing time among the stages in many cases. According to the semiconductor memory device 200, since a time period of the stage which requires the longest processing time can be shortened, the memory cycle time Tc can be reduced.

Furthermore, according to the semiconductor memory device 200, the potential difference having an amplitude smaller than the full amplitude of CMOS is transmitted to the next stage. As a result, the power consumption can be reduced.

According to this embodiment of the present invention, the time period of each of the stages included in the pipeline processing is intended to be shortened by the following configuration. The address register 102 is provided as the address input section, while the decode register 104 is provided as the address output section. The address decode time period is divided into a plurality of stages so as to divide the processing time for the respective stages. In addition, the output data register is provided for the sense amplifier output section so as to determine the stage for externally outputting the data, thereby inhibiting the processing time at the stage of output of the sense amplifier from increasing.

In this embodiment of the present invention, the stages of the pipeline processing are defined as follows.

First stage: address input to decode
Second stage: activation of the word line to read of data on the bit lines
Third stage: transmission of the potential difference to amplification of data by means of the sense amplifiers
Fourth stage: external output of the data The time period from input of the address to output of the data, that is, memory access time is equal to 1.5 cycles. Although the case where a half phase of the memory cycle time is used for each stage is described in this embodiment of the present invention, the entire phase of memory cycle time can be used for each stage depending on the processing time of each stage. In this manner, the time period divided for each stage can be easily adjusted.

In the case where memory access requests are successively issued at time $T_2$, the word line WL corresponding to the address $A_m$ is activated by the output of the decode register 104 at time $T_3$ so as to read the data on the pair of bits BL and XBL, as in the case of precious access request. In this case, at time $T_2$, the potential difference between the pair of the bit lines BL and XBL is amplified and output in the circuit on the sense amplifier 110 side, while the pair of bit lines BL and XBL on the side of the memory cell array 101 are allowed to respond to different access requests since the bit lines BL and XBL are completely separated from the circuits on the side of the sense amplifiers 110. At time $T_3$, the precharge operation of the pair of bit lines BL and XBL is started in the circuits on the sense amplifier 110 side by the control circuit. Then, the switches $SW_1$ and $SW_2$ of the switch section 106 are connected to the pair of bit lines BL and XBL on the memory cell array 101 side so as to prepare for the next memory access. At time $T_4$ and time $T_5$, the data is transmitted to the stage of sense amplifier operation and the external output stage of the data in the same manner as that previously described for the reading operation of the address $A_1$. As a result, the data $D_m$ is output. Therefore, even in the case where memory access requests are successively issued as described above, the data can be output with normal memory access time.

The case where a request to read the data for the memory issued is described above. When a request to write the data is issued, a writing operation is performed as follows. The write data is stored in the write data register 113 simultaneously with input of the address. At time $T_5$, the word line WL is activated, so that the timing control circuit 112 enables the write circuit 114 and the data is written to the memory cells 100 simultaneously. The stages until the word line WL is activated are the same as those of the read operation. Thus, it is not necessary to perform particular control.

The capacitor elements may be realized in any form as long as they have small voltage dependence. For example, such capacitor elements can be realized as parallel plane capacitances between metal wirings. In this case, the capacitor elements can be realized by in the fabrication of conventional memory.

As described above, according to the present embodiment, potential difference transmission circuits for transmitting the potential difference of small amplitudes between the pair of bit lines to the next stage of the pipeline processing are inserted between the memory cell array and the sense amplifiers for amplifying the data stored in the memory cell. At this stage, signal transmission is not performed at a full amplitude of the CMOS. Instead, a signal is transmitted at a small amplitude so as to read the data from the memory cell and transmit it to the pair of bit lines. In such a manner, the circuit delay time of the processing time in the memory cell array, which is the most critical to the operation in terms of time, is reduced. Accordingly, the time period of the stage, which requires the longest delay time of the pipeline memory, is reduced. As a result, the delay time periods of the respective stages are equalized, thereby realizing the reduction in cycle time.

As described above, according to the present invention, a semiconductor memory device with low power consumption, which is capable of remarkably reducing cycle time as compared with that required for a conventional memory system, can be realized.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A potential difference transmission device comprising:

a capacitor element for storing a charge;

a switching element connected to one end of the capacitor element, which is turned so as to electrically connect one of a data input terminal and a ground line to the end of the capacitor element; and a potential determination circuit operatively coupled to other end of the capacitor element, for determining a potential of the other end of the capacitor element.

* * * * *